(12) United States Patent  (10) Patent No.: US 9,337,611 B2
Daiber et al.  (45) Date of Patent: May 10, 2016

(54) SMALL PACKAGED TUNABLE LASER TRANSMITTER

(71) Applicant: NeoPhotonics Corporation, San Jose, CA (US)

(72) Inventors: Andrew John Daiber, Emerald Hills, CA (US); Xiaoguang He, Diamond Bar, CA (US)

(73) Assignee: NeoPhotonics Corporation, San Jose, CA (US)

( * ) Notice: Subject to any disclaimer, the term of this patent is extended or adjusted under 35 U.S.C. 154(b) by 2 days.

(21) Appl. No.: 13/899,467

(22) Filed: May 21, 2013

(65) Prior Publication Data

US 2013/0250980 A1   Sep. 26, 2013

Related U.S. Application Data

(63) Continuation-in-part of application No. 13/774,309, filed on Feb. 22, 2013, which is a continuation-in-part of application No. 13/080,519, filed on Apr. 5, 2011, now Pat. No. 8,462,823, which is a continuation-in-part of application No. 12/722,825, filed on Mar. 12, 2010, now abandoned, and a continuation-in-part of application No. 12/537,026, filed on Aug. 6, 2009, now abandoned.

(60) Provisional application No. 61/444,362, filed on Feb. 18, 2011.

(51) Int. Cl.
*H01S 3/10* (2006.01)
*H01S 5/00* (2006.01)
(Continued)

(52) U.S. Cl.
CPC ........... *H01S 5/0085* (2013.01); *H01S 5/02248* (2013.01); *G02B 6/4208* (2013.01); *G02B 6/4269* (2013.01); *G02B 6/4271* (2013.01); *G02B 6/4286* (2013.01); *H01S 3/105* (2013.01); *H01S 5/005* (2013.01); *H01S 5/0064* (2013.01); *H01S 5/0265* (2013.01); *H01S 5/02284* (2013.01); *H01S 5/02415* (2013.01); *H01S 5/02438* (2013.01); *H01S 5/0683* (2013.01); *H01S 5/141* (2013.01)

(58) Field of Classification Search
CPC ............ H01S 5/02248; H01S 5/02438; H01S 5/02415; H01S 5/005; H01S 5/0064; H01S 3/10
USPC .......................... 372/20, 26; 398/83; 359/344
See application file for complete search history.

(56) References Cited

U.S. PATENT DOCUMENTS 5,319,659 A   6/1994 Hohimer
5,459,747 A   10/1995 Takiguchi et al.
(Continued)

FOREIGN PATENT DOCUMENTS

EP   0687045 A2   12/1995

OTHER PUBLICATIONS

European Search Report dated Jun. 4, 2014 for European Patent No. 2770590 A1; 3 pgs.
(Continued)

*Primary Examiner* — Tuan Nguyen
(74) *Attorney, Agent, or Firm* — Mueting, Raasch & Gebhardt, P.A.

(57) ABSTRACT

A tunable laser transmitter configured in a small package subassembly coupled to a printed circuit board such as an ITLA assembly. The tunable laser transmitter includes a housing with a volume formed by exterior walls. An electrical input interface is positioned at the first end of the housing. An optical output interface is positioned at the second end of the housing and configured to transmit a modulated optical beam.

16 Claims, 4 Drawing Sheets

(51) Int. Cl.
*H01S 5/022* (2006.01)
*H01S 5/024* (2006.01)
*H01S 5/0683* (2006.01)
*H01S 5/14* (2006.01)
*H01S 3/105* (2006.01)
*H01S 5/026* (2006.01)
*G02B 6/42* (2006.01)

(56) References Cited

U.S. PATENT DOCUMENTS

| | | | |
|---|---|---|---|
| 5,579,327 A | 11/1996 | Ohtateme et al. | |
| 5,592,503 A | 1/1997 | Welch et al. | |
| 6,137,814 A | 10/2000 | Brosson et al. | |
| 6,240,312 B1 | 5/2001 | Alfano et al. | |
| 6,295,308 B1 | 9/2001 | Zah | |
| 6,665,321 B1 | 12/2003 | Sochava et al. | |
| 6,822,981 B2 | 11/2004 | Jacquet | |
| 6,853,654 B2 | 2/2005 | McDonald et al. | |
| 6,917,288 B2 | 7/2005 | Kimmel et al. | |
| 6,941,077 B2 | 9/2005 | Aronson et al. | |
| 6,952,531 B2 | 10/2005 | Aronson et al. | |
| 6,957,021 B2 | 10/2005 | Aronson et al. | |
| 6,990,324 B2 | 1/2006 | Laroia et al. | |
| 7,050,720 B2 | 5/2006 | Aronson et al. | |
| 7,058,310 B2 | 6/2006 | Aronson et al. | |
| 7,079,775 B2 | 7/2006 | Aronson et al. | |
| 7,149,430 B2 | 12/2006 | Hosking et al. | |
| 7,157,712 B2 * | 1/2007 | Flanders et al. | 250/339.07 |
| 7,162,160 B2 | 1/2007 | Aronson et al. | |
| 7,184,668 B2 | 2/2007 | Aronson et al. | |
| 7,200,337 B2 | 4/2007 | Hosking et al. | |
| 7,257,142 B2 | 8/2007 | Sochava et al. | |
| 7,302,186 B2 | 11/2007 | Light et al. | |
| 7,346,278 B2 | 3/2008 | Aronson et al. | |
| 7,710,581 B2 | 5/2010 | Harker | |
| 7,771,071 B2 | 8/2010 | Finot et al. | |
| 7,794,157 B2 | 9/2010 | Hudgins et al. | |
| 7,961,374 B2 | 6/2011 | Finot et al. | |
| 8,462,823 B2 | 6/2013 | Daiber et al. | |
| 2002/0054614 A1 | 5/2002 | Jin | |
| 2002/0071458 A1 | 6/2002 | Iwafuji | |
| 2002/0131466 A1 | 9/2002 | Salvatore et al. | |
| 2002/0167977 A1 * | 11/2002 | Nakabayashi et al. | 372/36 |
| 2003/0053170 A1 | 3/2003 | Levinson et al. | |
| 2003/0086448 A1 | 5/2003 | Deacon | |
| 2003/0095311 A1 | 5/2003 | Liu et al. | |
| 2003/0161570 A1 | 8/2003 | Paniccia | |
| 2004/0071181 A1 | 4/2004 | Huang | |
| 2004/0100686 A1 * | 5/2004 | Flanders et al. | 359/341.1 |
| 2004/0101016 A1 * | 5/2004 | McDonald et al. | 372/97 |
| 2004/0197101 A1 | 10/2004 | Sasser et al. | |
| 2005/0025500 A1 | 2/2005 | Hallemeier et al. | |
| 2005/0074039 A1 * | 4/2005 | Kuramachi et al. | 372/22 |
| 2005/0196111 A1 | 9/2005 | Burdick et al. | |
| 2005/0213618 A1 | 9/2005 | Sochava et al. | |
| 2006/0045525 A1 | 3/2006 | Lee et al. | |
| 2006/0072634 A1 | 4/2006 | Daiber | |
| 2006/0133819 A1 | 6/2006 | Yu et al. | |
| 2007/0092257 A1 | 4/2007 | Smith et al. | |
| 2007/0140690 A1 | 6/2007 | Aronson et al. | |
| 2007/0263713 A1 | 11/2007 | Aronson | |
| 2008/0050113 A1 * | 2/2008 | Mathes | 398/17 |
| 2008/0166131 A1 | 7/2008 | Hudgins et al. | |
| 2008/0298810 A1 | 12/2008 | Crosby et al. | |
| 2009/0003398 A1 * | 1/2009 | Moto | 372/36 |
| 2009/0119686 A1 | 5/2009 | Monroe | |
| 2011/0032955 A1 | 2/2011 | Daiber | |
| 2011/0033192 A1 | 2/2011 | Daiber et al. | |
| 2011/0110388 A1 | 5/2011 | Baroni et al. | |
| 2011/0182305 A1 | 7/2011 | Daiber et al. | |
| 2013/0177034 A1 | 7/2013 | Liu et al. | |

OTHER PUBLICATIONS

U.S. Appl. No. 13/567,307, filed Aug. 6, 2012, He et al.
Akulova et al., "10 Gb/s Mach-Zehnder modulator integrated with widely-tunable sampled grating DBR Laser," *Optical Fiber Communication Conference*, 2004; 3 pgs.
Griffin et al., "Compact, High Power, MQW InP Mach-Zehnder Transmitters with Full-band Tunability for 10 Gb/s DWDM," *ECOC Proceedings*, 2005; 4:903-904.

* cited by examiner

SMALL PACKAGED TUNABLE LASER TRANSMITTER

REFERENCE TO RELATED APPLICATIONS

The present application is a continuation-in-part of U.S. patent application Ser. No. 13/774,309, filed Feb. 22, 2013, which is a continuation-in-part of U.S. patent application Ser. No. 13/080,519, filed Apr. 5, 2011, now U.S. Pat. No. 8,462, 823, which in turn claims priority to provisional application No. 61/444,362, filed Feb. 18, 2011, and which in turn is a continuation-in-part of U.S. patent application Ser. No. 12/722,825, filed Mar. 12, 2010, and which in turn is a continuation-in-part of U.S. patent application Ser. No. 12/537, 026, filed Aug. 6, 2009, each of which applications are incorporated by reference herein in their entirety.

FIELD OF THE INVENTION

The present application is directed to a tunable laser based transmitter and, more particularly, to a small, packaged tunable laser transmitter assembly.

BACKGROUND

Tunable lasers may be packaged as a component of an optical transceiver, or may be used in other applications outside of an optical transceiver. Tunable lasers are generally packaged with other components including an electrical interface and an optical interface.

There is an ever-constant challenge in the industry to reduce the size of tunable laser packages, modulation components, and tunable laser transmitters. The reduction in size may allow lasers and transmitters to be used in a greater number of applications. The reduction in size provides numerous design challenges for the package components to fit within the limited space and also not compromise performance or reliability.

In applications in which tunable lasers and transmitters are a component of an optical transceiver, the tunable lasers and transmitters should be sized for use with one of the various form factors. The various form factors provide standardized dimensions and electrical input/output interfaces that allow devices from different manufacturers to be used interchangeably. Examples of form factors include but are not limited to XENPAK, SFF ("Small Form Factor"), SFP ("Small Form Factor Pluggable"), XFP ("10 Gigabit Small Form Factor Pluggable"), ITLA ("Integrable Tunable Laser Assembly"), and the micro-ITLA ("micro-Integrable Tunable Laser Assembly").

Therefore, while the parent applications have been directed to the tunable laser component, there is also a need for a small, packaged tunable laser transmitter assembly for various applications.

SUMMARY

The present application is directed to tunable laser transmitters configured in a small package, similar to that of the tunable laser packages described in the parent applications. The tunable lasers may include a rectangular housing, an electrical input interface, an optical output, a tunable semiconductor laser and a focusing lens assembly. The rectangular housing has a volume of less than 0.6 cubic centimeters, with six planar exterior walls including a bottom, a top, opposing first and second ends, and opposing sidewalls. The exterior walls form a hermetically sealed interior space that includes a major axis that extends through the first and second ends. The electrical input interface is positioned at the first end of the housing and aligned with the major axis. The optical output interface is positioned at the second end of the housing and aligned with the major axis. A modulator is provided in the package to modulate the continuous wave (CW) optical beam of the laser and produce a modulated optical beam at the optical output interface of the package. The tunable semiconductor laser is positioned in the interior space and operable to emit a laser beam having a selectable wavelength that may be adjusted by an electrical input signal to the laser. The focusing lens assembly is positioned in the interior space along an optical path of the laser beam to operatively couple the modulated optical output beam to the optical output interface.

In another aspect, the present disclosure provides a small, packaged tunable optical transmitter comprising a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends; an electrical input interface positioned at the first end of the housing and aligned with the major axis, the electrical input interface configured to receive an information-containing electrical signal; an optical output interface positioned at the second end of the housing and aligned with the major axis, the optical output interface configured to transmit an optical communication beam; a tunable semiconductor laser positioned in the interior space and operable to emit a laser beam having a selectable wavelength; and a semiconductor-based modulator positioned in the interior space along an optical path of the laser beam and, the semiconductor-based modulator configured to impart modulation to the laser beam corresponding to the information-containing electrical signal received through the electrical input interface; and a semiconductor optical amplifier positioned in the interior space and having an input operably coupled to the output of the modulator and an output operatively coupled to the optical output interface.

In some embodiments, the information-containing RF signal input is from 10 to 25 GHz, or four channels each with a frequency in the range of 10 to 25 GHz.

In another aspect the present disclosure provides a small, packaged tunable laser subassembly comprising: a rectangular housing with six planar sides including a bottom, a top, first end, second end, and two opposing sidewalls, the housing including a hermetically sealed interior space with a length measured between the first and second ends and a width measured between the opposing sidewalls, the length being larger than the width; laser components positioned in the interior space and including coupling optics and an external cavity laser with a tunable filter, the laser components aligned within the interior space with an optical path of a laser beam that emanates at the external cavity laser and extends along the coupling optics substantially perpendicular to the first and second ends and along a portion of the length of the housing; an electrical input interface positioned at the first end of the housing; and an optical output interface positioned at the second end of the housing and configured to transmit a modulated optical signal having an optical output power of 40 mW or less; and a modulator in the interior of the housing for modulating the laser beam from the external cavity laser with an information-containing signal at a frequency of at least 10 GHz.

In another embodiment, the modulator is an IQ modulator.

In another aspect the present disclosure provides an apparatus comprising: an integrated structure having front and rear facets optically connected via a waveguide passing therethrough, the integrated structure further including: a gain section to provide a gain operation on optical energy in an external cavity laser, the gain operation controlled by a first electrical signal, wherein the gain section is part of the external cavity laser and is coupled to a first independent electrode and a common electrode; a modulator section disposed adjacent to the gain section, to modulate an optical output passing through a portion of the waveguide passing through the modulator section in response to a second electrical input, and having a facet defining the front facet of the integrated structure; a partially-reflective region disposed between the gain section and the modulator section, the partially-reflective region having a reflectivity of between 2 and 10 percent; a semiconductor optical amplifier (SOA) section disposed adjacent to the modulator section to amplify the optical energy emitted by the external cavity laser responsive to a third electrical signal, the SOA section coupled to a third independent electrode and the common electrode; and a bias circuit coupled to provide an independent bias current to each of the first, second and third independent electrodes.

In another aspect the present disclosure provides a small, packaged tunable optical transmitter comprising a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends; an electrical input interface positioned at the first end of the housing and aligned with the major axis, the electrical input interface configured to receive an information-containing electrical signal at an RF frequency between 10 GHz and 100 GHz; an optical output interface positioned at the second end of the housing and aligned with the major axis, the optical output interface configured to transmit an optical communication beam; a tunable semiconductor laser positioned in the interior space and operable to emit a laser beam having a selectable wavelength; and a semiconductor-based modulator positioned in the interior space along an optical path of the laser beam and, the semiconductor-based modulator configured to impart IQ modulation to the laser beam corresponding to the information-containing electrical signal received through the electrical input interface.

In some embodiments, the tunable semiconductor laser is an external cavity laser that includes a tunable filter.

In some embodiments, the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

In some embodiments, there further comprises a base in the interior of the housing; a structure operatively coupled to the base, having a rear facet and a substantially non-reflective front facet optically coupled via a waveguide passing there through, the structure further including: a gain section to emit a plurality of photons in response to a first electrical input, having a facet defining the optical output facet.

In some embodiments, the optical path is aligned along the major axis of the housing.

In some embodiments, the coupling optics includes a focusing lens.

In some embodiments, there further comprises a cavity length actuator positioned in the interior space along an optical path of the beam downstream from the first optical filter and along the optical path of the beam emitted from the first optical filter and functioning to adjust and lock an optical pathlength of the external cavity tunable laser.

In some embodiments, the cavity length actuator is a block of silicon having a planar surface tilted with respect to the optical axis to prevent the incoming light from the laser from reflecting back into the cavity of the laser.

In some embodiments, the cavity length actuator is disposed between the first and second optical filters of the Vernier tuning mechanism, and further includes an anti-reflection coating on its planar surface.

In some embodiments, a thermoelectric cooler is positioned within the interior space between the bottom of the housing and at least one of the tunable semiconductor lasers and the coupling optics.

In some embodiments, the electrical input interface includes a row of pins extending from the housing to enable an electrical connector to be coupled thereto.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

DETAILED DESCRIPTION

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
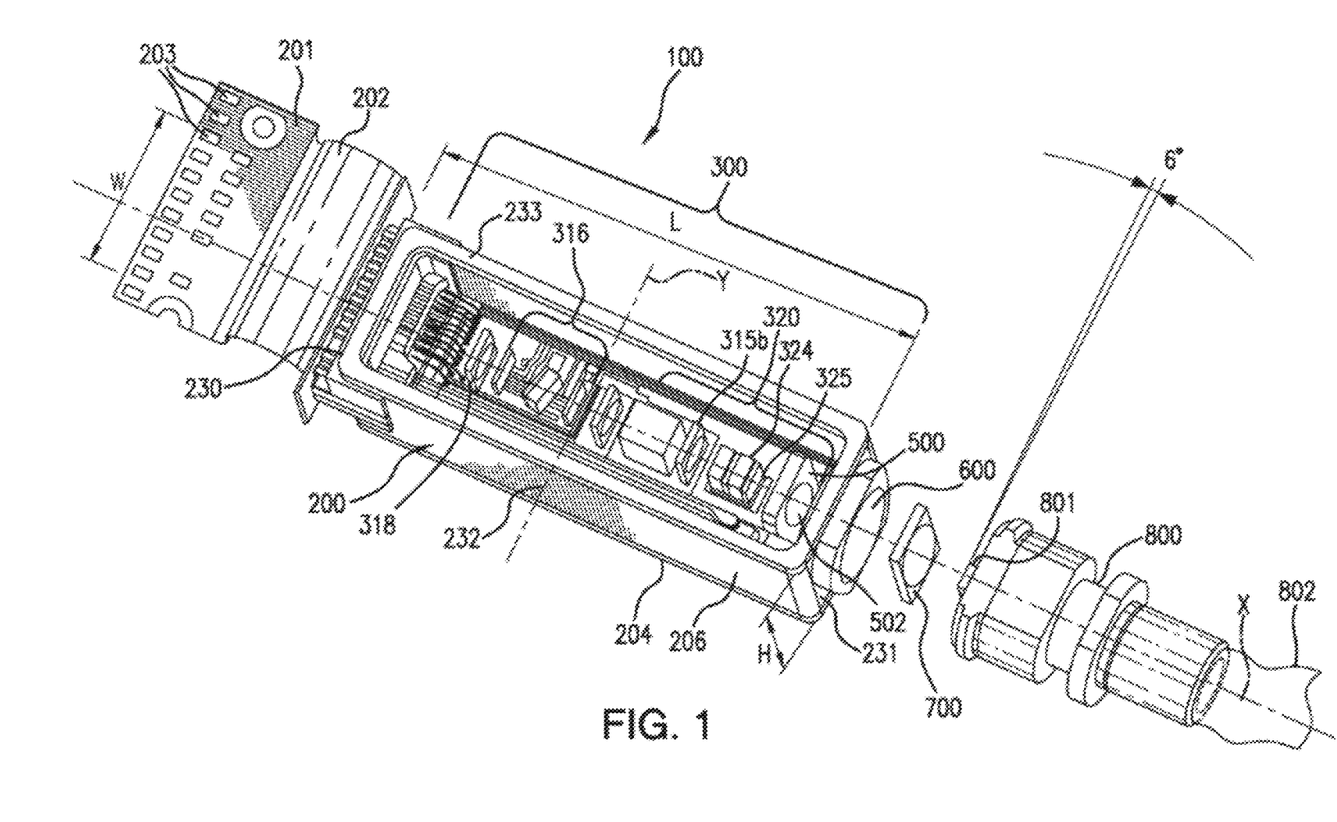
FIG. 1 is a top perspective view of a small, packaged tunable laser transmitter according to one embodiment.
Figure 3:
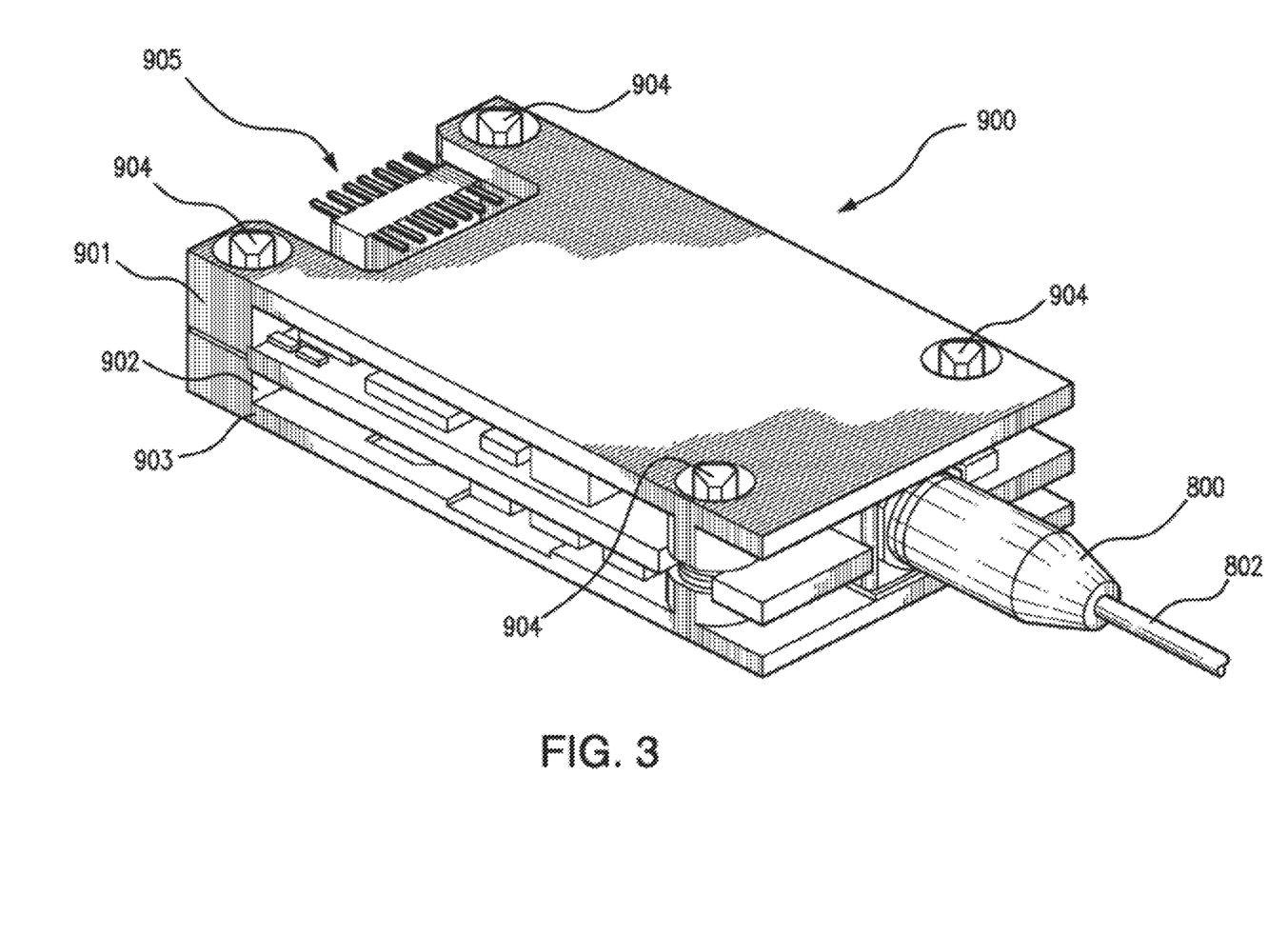
FIG. 3 is a top perspective view of a small, packaged tunable laser transmitter subassembly according to one embodiment.

The present application is directed to a small, packaged tunable laser 100 as illustrated in FIG. 1, and a subassembly including the tunable laser as illustrated in FIG. 3.

The tunable laser 100 is packaged in a housing 200 that forms an interior space for housing the laser components 300. The laser 100 is packaged in housing which is particularly small and compact in size which makes it especially suitable for use in pluggable optical transceivers and various other module configurations or applications. In the present disclosure, the laser 100 is coupled to a printed circuit board which includes circuitry for data packet formatting and control of the power and frequency of the laser, and an electrical and mechanical interface for mounting the packaged subassembly on a customer's transmitter platform or card rack assembly.

The housing 200 includes a generally rectangular body 206 with exterior walls that forms a substantially rectangular shape. The body 206 includes a bottom 204, a cover (not illustrated), first and second ends 230, 231, and opposing sidewalls 232, 233. The cover may be substantially planar and positioned on the top surfaces of the first and second ends 230, 231 and opposing sidewalls 232, 233. In one embodiment, the cover is substantially identical to the bottom 204.

The housing 200 includes a substantially rectangular shape with a width W formed by the opposing sidewalls 232, 233, a length L formed by the first and second ends 230, 231, and a height H that extends between the bottom 204 and top of the sidewalls 232, 233 and ends 230, 231. The housing 200 may include various sizes. In one specific embodiment, the width W is about 5.4 mm, the length L is about 17.1 mm, and the height H is about 5.9 mm. The volume of the interior space formed by the housing 200 may also vary depending upon the application. Exemplary volumes may range from between about 400 mm$^3$ to about 600 mm$^3$. In one specific embodiment, the volume is about 545 mm$^3$. The housing 200 includes an elongated shape with a major axis X extending along the length L through the first and second ends 230, 231, and a minor axis Y perpendicular to the major axis and extending through the opposing sidewalls 232, 233. The housing 200 may be hermetically sealed to protect the laser components 300 from humidity and other environmental conditions.

On the first end 230 of the housing 200 is an electrical interface 202. The electrical interface 202 is configured to receive power and control information-containing electrical signals (which may have an RF frequency from 10 to 25 GHz, or in four channels each in the range of 10 to 25 GHz), or control signals such as a signal to adjust the wavelength of the laser, or other characteristics of the output laser beam. In the embodiment of FIG. 1, the electrical interface 202 includes a connector portion 201 that is aligned with the major axis X, and includes various electrical connection pads 203. The electrical interface 202 may also include additional flexible cables that extend outward from the first end 230. In at least another embodiment, the electrical interface 202 may be configured as two parallel rows of pins.

An optical output interface 800 extends outward from the second end 231 of the housing 200. In one embodiment, the optical output interface 800 is an optical fiber ferrule or "pigtail" aligned with the major axis X of the housing 200. The optical output interface 800 is configured to transmit a continuous wave optical beam that is emitted from the laser components 300 over an optical fiber contained within the interface. The optical output power may be 40 mW or less.

Figure 2:
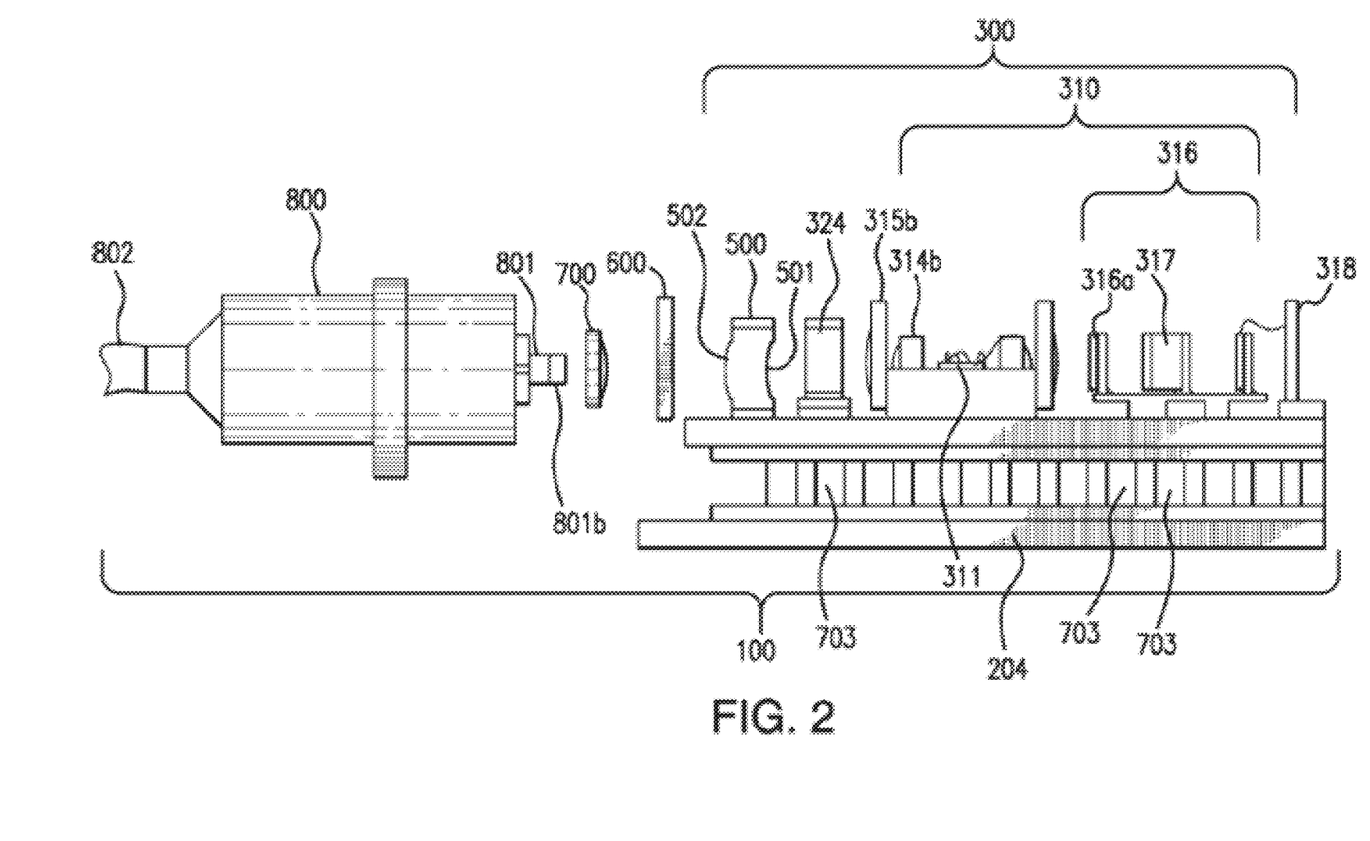
FIG. 2 is a side elevational view of the interior components in the tunable laser transmitter of FIG. 1.

The laser components 300 generally include an external cavity laser and coupling optics 320. The external cavity laser 310 includes a first subassembly 311 including a diode gain chip comprising a Fabry-Perot diode laser with a substantially non-reflective front facet and a highly reflective rear facet. The gain chip may also include a curved-waveguide structure as more particularly described in U.S. patent application Ser. No. 13/567,307, filed Aug. 6, 2012.

On the subassembly 311, downstream of the optical output of the gain chip is a reverse biased semiconductor-based modulator positioned in the interior space along an optical path of the output laser beam. The semiconductor-based modulator is configured to impart modulation to the laser beam corresponding to the information-containing electrical signal received through the electrical input interface 202. In some embodiments, the subassembly 311 may also include a semiconductor optical amplifier, downstream of the modulator. The semiconductor optical amplifier is positioned in the interior space and has an input operably coupled to the output of the modulator and an output operatively coupled to the optical output interface 314b.

In some embodiments, the subassembly 311 may be configured with the semiconductor optical amplifier disposed directly adjacent to the gain chip, and the modulator positioned downstream of the semiconductor optical amplifier and having an input operably coupled to the output of the semiconductor optical amplifier, with the output of the modulator then being directly coupled to the optical output interface 314b.

In some embodiments, the subassembly 311 may be configured an integrated structure having front and rear facets optically connected via a waveguide passing there through, the integrated structure further including a gain section and a modulator section, with the gain section being configured to provide a gain operation on optical energy in an external cavity laser, the gain operation controlled by a first electrical signal, wherein the gain section is part of the external cavity laser and is coupled to a first independent electrode and a common electrode.

The integrated structure further includes a modulator section disposed adjacent to the gain section, the modulator section functioning to modulate an optical output beam passing through a portion of the waveguide in the modulator section in response to a second electrical input.

In some embodiments, an air gap forming a partially-reflective region may be disposed between the gain section and the modulator section, the partially-reflective region having a reflectivity of approximately 2-10 percent.

In some embodiments, a semiconductor optical amplifier (SOA) section may be disposed adjacent to the modulator section to amplify the optical energy emitted by the external cavity laser responsive to a third electrical signal, the SOA section being coupled to a third independent electrode and the common electrode. A bias circuit may be provided on subassembly 311 and coupled to each of the electrodes of the integrated structure so as to provide an independent bias current to each of the first, second and third independent electrodes.

The first subassembly also includes a collimating lens 314b and a steering lens 315b in the path of the beam emitted from the subassembly 311. The collimating lens 314b and the steering lens 315b are both mounted on the same base as the subassembly 311.

The external cavity laser 310 further includes a second subassembly including a tunable filter 316 (including tunable filter elements 316a and 316b), a cavity length actuator 317 disposed between the tunable filter elements 316a and 316b, and a reflective element 319.

Possible implementations of the tunable filter 316 include but are not limited to Bragg gratings, Fabry-Perot etalons, and liquid crystal waveguides. In one embodiment, the tunable filter 316 includes a pair of spaced apart tunable elements or etalons 316a, 316b. The etalons 316a, 316b are Fabry-Perot spaced etalons that are positioned in a parallel configuration. The first etalon 316a includes a thickness measured between opposing faces and a refractive index according to the material from which it is constructed. The second etalon 316b includes a thickness measured between its opposing faces and a refractive index according to the material from which it is constructed. The etalons 316a, 316b may be constructed from the same or different materials, and may include the same or different thicknesses. Etalons 316a, 316b may be constructed from various materials, such as but not limited to silicon and gallium arsenide. One or both etalons 316a, 316b are tunable by a temperature-induced change in their refractive indexes and/or a temperature-induced change in their thickness. In one embodiment, the etalons 316a, 316b are tunable by simultaneous control of both the refractive index and the physical thickness.

In one embodiment, the tunable filter 316 utilizes a Vernier tuning mechanism including respective first and second optical filters 316a, 316b having respective sets of transmission peaks having slightly different free spectral ranges and similar finesses. Tuning is performed by shifting the set of transmission peaks of the second optical filter 316b relative to the set of transmission peaks of first optical filter 316a to align a single transmission peak of each of the first and second sets of transmission peaks.

The actuator 317 may be a block of silicon which is polished and anti-reflection coated, and is disposed between etalons 316a and 316b. In some embodiments the actuator 317 may use thermal, mechanical, or electro-optical mechanisms to adjust the optical pathlength of the laser cavity. In some embodiments the actuator 317 is oriented in the cavity with a seven degree tilt with respect to the optical axis of the beam directed to it from etalon 316a, so that the light circulating in the optical cavity does not reflect back into the cavity regardless of the efficacy of the anti-reflection coating. The actuator 317 may also lock the optical path length.

The external cavity tunable laser 310 may be configured with the tunable filter 316a/316b being decoupled from the gain chip 311. This configuration results in the tunable filter 316a/316b being very stable and therefore does not require an external wavelength locker as required in Distributed Feedback (DFB) lasers and Distributed Bragg Reflector (DBR) lasers. Other advantages of the external cavity tunable laser 310 over these other lasers are the extremely narrow linewidth and very high side mode suppression ratio.

The coupling optics 320 provide isolation and coupling to the optical output interface 801. The coupling optics 320 efficiently couple light from the gain chip 311 to the optical output interface 801. A total optical magnification of the coupling optics 320 (including . . . ) and the external cavity lenses 314b, 315b is chosen to correct for the difference between mode field diameters of the gain chip 311 and the optical fiber 802.

The coupling optics 320 directly downstream of the etalon 316b includes a wedge shaped support 400 which supports a planar beam splitter 401. The beam splitter 401 is arranged on the support 400 so that its plane is at a 45 degree angle with respect to the incoming beam. A photodiode 402 is mounted on the surface of the base below the beam splitter 401. The beam splitter 401 directs a small portion (e.g. 5%) of the output beam to the photodiode 402, which functions to sense the intensity level of the tunable laser output, so that the user may appropriately control the current to the laser to achieve the desired optical output level or intensity. The remainder of the output beam is directed by a beam splitter to the optical isolator 324.

The positioning of the optical isolator 324 downstream of the beam splitter 401 is one of the features of the embodiment of the present disclosure that distinguishes it from the parent application U.S. patent application Ser. No. 13/080,519, filed Apr. 5, 2011. Experimental data has shown that the positioning of the optical isolator 324 upstream of the beam splitter 401 resulted in a noisy feedback signal, which for many applications and operational conditions was undesirable.

The coupling optics 320 includes an optical isolator 324 disposed directly downstream of the beam splitter 401. The optical isolator 324 may include a two-stage isolator that prevents light reflected from coupling optics 320 from getting back into the external cavity tunable laser 310. The isolator 324 may also rotate a light polarization by 90 degrees to improve transmission. In one embodiment, the optical path is aligned substantially along the major axis X of the housing 200.

In some embodiments, the isolator 324 is mounted on a piezoelectric transducer (PZT) 325. The PZT 325 functions to provide dithering during frequency tuning, which enables locking onto the target frequency more rapidly. The PZT in turn is mounted on the sled or circuit board which has traces thereon that provide the electrical connection to the PZT 325.

The coupling optics 320 directly downstream of the optical isolator 324 is a single one-piece integral collimating lens 500 including a concave first surface 501 and a convex second surface 502. Downstream from the collimating lens 500 is a window 600 which is attached to the housing 200 and permits the collimated beam to exit the housing 200. Outside of the housing 200 and coupled to the collimated beam is the optical output interface, which includes a fiber focus alignment lens 700 and the optical fiber ferrule 800. In the embodiment depicted, the cladded optical fiber 802 is a "pig-tail" that extends for a relatively short distance to allow coupling to other subassemblies. In another embodiment (not depicted), the window 600 or the alignment lens 700 may be the final downstream components associated with the housing 200, to allow the user to couple an optical fiber directly to the outside of the housing 200 through a pluggable connector or other optical interface.

In some embodiments, as depicted in FIG. 2, the end portion of the ferrule 800 includes a polarizer 801b which has a planar entry end face which is inclined at an angle of about six (6) degrees from a plane which is normal to the incoming central beam from the lens 700. The inclination of the plane is provided to prevent reflections of the incoming beam from the surface of the planar entry end face from going back into the lens 700 and back through the coupling optics 800 into the laser cavity.

A thermoelectric cooler includes first and second plates 702 and 704, respectively, separated by intermediate members 703 that provides a base for supporting the various elements of the tunable laser 100. In one embodiment, the thermoelectric cooler (comprised of elements 702, 703, 704) is positioned between the bottom 204 of the housing 200 and one or more of the laser components 300. The plates 702, 704 may be constructed from a variety of materials, including ceramics. The intermediate members 703 each include a first end operatively connected to the first plate 702 and a second end operatively connected to the second plate 704. The intermediate members 703 are electrically connected in series by connectors. The intermediate members 703 are constructed from semiconductor material that allows for electron flow through the member 703 when connected to a DC power source. In use, as the DC power source is activated and a current passes through the series of intermediate members 703 the current causes a decrease in temperature at the first plate 702 that absorbs heat from the laser components 300. The heat is transferred through the plate 702 and intermediate members 703 into the second plate 704. This heat may then be transferred from the second plate 704, such as to a heat sink.

Likewise, the temperature of the tunable filter 316 and cavity length actuator 317 may be separately controlled from the other laser components 300. A bench 318, which may be composed of a glass, may provide thermal isolation from the thermoelectric cooler 400.

One example of a tunable laser is disclosed in U.S. Pat. No. 7,257,142, herein incorporated by reference. Such patent describes what may be called an "integrated design" in contrast with an arrangement of discrete components such as described in the present disclosure.

FIG. 3 is a top perspective view of the subassembly of FIGS. 1 and 2 as implemented as a component in a small, packaged tunable laser subassembly 900 with additional external control circuitry according to one embodiment, such as an ITLA or micro-ITLA form factor. The subassembly 900 is comprised of a top retention plate 901 which is rectangular in shape and approximately 37 mm×20 mm in dimension. A dual sided printed circuit board 902 is supported by the retention plate 901 on which the tunable laser 100 is mounted. A base plate 903 is disposed beneath the printed circuit board 901 and secured to the top retention plate 901 by four aluminum retention screws 904 which screw into respective cavities 907 on the base plate 903. The entire assembly 900 may be further mounted on an external support, carrier, or heat sink (not shown) of a line card of a transmitter subassembly by the four aluminum retention screws 904, which in some embodiments may extend through the respective cavities 907 and screw into a post (not shown) on the external support. An electrical connector 905 is also provided on the printed circuit board 901.

Figure 4:
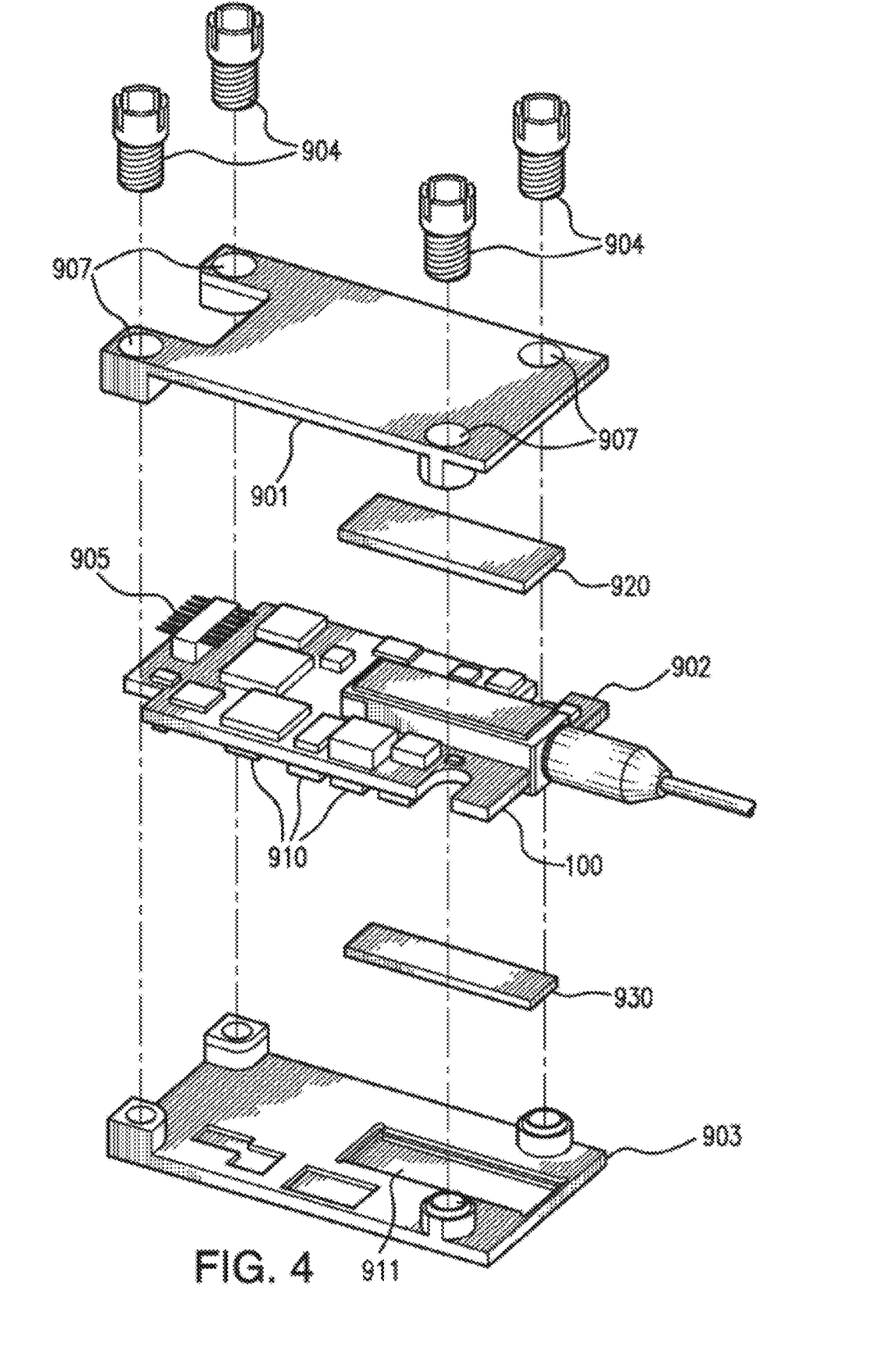
FIG. 4 is an exploded view of the small, packaged tunable laser transmitter subassembly of FIG. 3.

FIG. 4 is an exploded view of the small, packaged tunable laser subassembly of FIG. 3. This Figure depicts a retention pad 920 disposed on the top surface of the laser 100, and a thermal pad 930 on the bottom surface of the laser 100 and making direct thermal contact with an indentation 911 in the top surface of the base plate 903.

In some embodiments the thermal conductivity of the pad is 7 W/mk, although other values may be specified for different operational requirements. This Figure also depicts various electronic components 910 disposed on the top and bottom surfaces of the printed circuit board 902. The printed circuit board 902 is also seen to have a rectangular cut-out with a width equal to the width of the laser 100, allowing the laser 100 to be centrally mounted on the board with the top row of electrical pins on the laser 100 soldered to traces on the top side of the printed circuit board 902, and the bottom row of electrical pins on the laser 100 soldered to traces on the bottom side of the printed circuit board 902.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A small, packaged tunable optical transmitter comprising:
    a rectangular housing having a volume of less than 0.6 cubic centimeters, with six planar exterior walls including a bottom, a top, opposing first and second ends, and opposing sidewalls, the exterior walls forming a hermetically-sealed interior space that includes a major axis that extends through the first and second ends;
    an electrical input interface positioned at the first end of the housing and aligned with the major axis, the electrical input interface configured to receive an information-containing electrical signal;
    an optical output interface positioned at the second end of the housing and aligned with the major axis, the optical output interface configured to transmit an optical communication beam;
    a tunable semiconductor laser positioned in the interior space of the rectangular housing and operable to emit a laser beam having a selectable wavelength along an optical path;
    a semiconductor-based modulator positioned in the interior space of the rectangular housing along the optical path of the laser beam to receive the laser beam from the tunable semiconductor laser and to impart modulation to the laser beam corresponding to the information-containing electrical signal received through the electrical input interface to produce a modulated laser beam; and
    a semiconductor optical amplifier positioned in the interior space of the rectangular housing and operably coupled to the output of the modulator to amplify the modulated laser beam and to output the amplified, modulated laser beam through the optical output interface.

2. The tunable optical transmitter of claim 1, wherein the tunable semiconductor laser is an external cavity laser that includes a tunable filter, and wherein the entire optical path of the laser beam within the housing is aligned along the major axis of the housing.

3. The tunable optical transmitter of claim 2, wherein the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

4. The tunable optical transmitter of claim 3, further including a cavity length actuator positioned in the interior space along the optical path of the laser beam downstream from the first optical filter and along the optical path of the beam emitted from the first optical filter and functioning to adjust and lock an optical pathlength of the external cavity tunable laser.

5. The tunable optical transmitter of claim 4, wherein the cavity length actuator is a block of silicon having a planar surface tilted with respect to the major axis to prevent incoming light from the laser beam from reflecting back into the cavity of the laser.

6. The tunable optical transmitter of claim 3, further comprising a cavity length actuator disposed between the first and second optical filters of the Vernier tuning mechanism, and further including an anti-reflection coating on its planar surface.

7. The tunable optical transmitter of claim 1, wherein the tunable semiconductor laser comprises:
   a base in the interior space of the housing; and
   a structure operatively coupled to the base, having a front facet and a substantially non-reflective rear facet optically coupled via a waveguide passing therethrough, the structure further including a gain section to emit a plurality of photons in response to a first electrical input, and having a facet defining the rear facet of the structure.

8. The tunable optical transmitter of claim 1, further comprising:
   coupling optics coupling the output of the semiconductor optical amplifier to the optical output interface; and
   a ferrule having an entry aperture disposed adjacent to the coupling optics, wherein the entry aperture has a planar face which is inclined at an angle of from five to seven degrees from a plane which is normal to an incoming beam from the coupling optics so as to prevent reflections of the incoming beam from the surface of the planar entry end face from going back into the coupling optics.

9. The tunable optical transmitter of claim 1, further including:
   coupling optics coupling the output of the semiconductor optical amplifier to the optical output interface; and
   a thermoelectric cooler positioned within the interior space between the bottom of the housing and at least one of the tunable semiconductor laser and the coupling optics.

10. The tunable optical transmitter of claim 1, wherein the electrical input interface includes a row of pins extending from the first end of the housing to enable an electrical connector to be coupled thereto.

11. A small, packaged tunable laser transmitter subassembly comprising:
    a rectangular housing with six planar sides including a bottom, a top, a first end, a second end, and two opposing sidewalls, the housing including a hermetically: sealed interior space with a length measured between the first and second ends and a width measured between the opposing sidewalls, the length being larger than the width;
    coupling optics;
    an external cavity laser with a tunable filter configured to output a laser beam along an optical path, wherein the coupling optics are aligned along the optical path and, wherein the optical path extends along the coupling optics substantially perpendicular to the first and second ends and along a portion of the length of the housing;
    an electrical input interface positioned at the first end of the housing and including an input for receiving at least a 10 GHz RF information-containing signal;
    a modulator positioned in the interior space of the housing along the optical path to receive the laser beam from the external cavity laser, wherein the modulator comprises an electrode coupled to the electrical input interface to receive at least the 10 GHz RF information-containing signal to produce and output a modulated optical beam;
    an optical amplifier positioned in the interior space of the housing to receive the modulated optical beam from the modulator, to amplify the modulated optical beam, and to output an amplified, modulated optical beam, and
    an optical output interface positioned at the second end of the housing to receive the amplified, modulated optical beam from the optical amplifier and to transmit the amplified, modulated optical beam from the subassembly.

12. The subassembly of claim 11, further including a cavity length actuator positioned in the interior space along the optical path of the laser beam to adjust and lock a length of the optical path.

13. The subassembly of claim 12, wherein the cavity length actuator is a block of silicon having a planar surface tilted with respect to an optical axis defined by the optical path to prevent incoming light from the laser beam from reflecting back into the external cavity tunable laser.

14. The subassembly of claim 11, further comprising a cavity length actuator disposed between first and second optical filters of a Vernier tuning mechanism along the optical path, and wherein the cavity length actuator defines a planar surface including an anti-reflection coating.

15. The subassembly of claim 11, wherein the optical output interface comprises a ferrule connected to an optical fiber pigtail.

16. The subassembly of claim 11, wherein the coupling optics are positioned in the interior space of the housing along the optical path between the external cavity laser and a focusing lens assembly, the coupling optics including a pair of coupling lenses and an isolator.

* * * * *